United States Patent [19]

Hollyday et al.

[11] 3,961,295

[45] June 1, 1976

[54] SOLDERLESS FILTER ASSEMBLY

[75] Inventors: Robert David Hollyday, Hershey, Pa.; Jack Leo Bradbery, Evergreen Park, Ill.

[73] Assignee: AMP Incorporated, Harrisburg, Pa.

[22] Filed: Mar. 25, 1975

[21] Appl. No.: 561,808

[52] U.S. Cl. .................. 333/79; 333/70 S; 333/70 CR

[51] Int. Cl.[2] .................. H03H 7/04; H01G 4/42

[58] Field of Search .................. 333/79, 70 S, 70 CR; 317/242, 256

[56] References Cited

UNITED STATES PATENTS

| | | | |
|---|---|---|---|
| 2,994,048 | 7/1961 | Schlicke | 333/79 |
| 3,200,355 | 8/1965 | Dahlen | 333/79 |
| 3,320,557 | 5/1967 | Garstang | 333/79 |
| 3,588,758 | 6/1971 | Hurst | 333/79 |
| 3,721,869 | 3/1973 | Paoli | 333/79 X |
| 3,753,168 | 8/1973 | Schor | 333/70 S |
| 3,781,723 | 12/1973 | Harwood | 333/79 |

*Primary Examiner*—Alfred E. Smith
*Assistant Examiner*—Marvin Nussbaum
*Attorney, Agent, or Firm*—Gerald K. Kita

[57] ABSTRACT

A solderless filter assembly wherein a filter in the form of a sleeve having a hollow bore extending therethrough is placed in electrical contact with a mounting body positioned therearound and an electrically conductive pin passing through the bore of the filter without requirement of solder. This is accomplished by providing an internal spring positioned around the pin and having convex tines thereon which provide a pressure fit with the internal diameter of the filter sleeve and is frictionally locked onto the pin. A second spring having concave tines is positioned around the outer diameter of the filter sleeve and provides a pressure fit therewith, the outer spring also making electrical contact with the shell or mounting body surrounding the filter. The filter sleeve and spring members are isolated from the external environment by pot stops which are positioned within cut out regions of the mounting body. Potting material is then placed into the hollow regions in the mounting body and against the pot stop to lock the pin in place within the mounting body by providing a bond to both the pin and the mounting body as well as to the pot stop. One end of the pin has an enlarged region positioned within the potting material to prevent lateral or rotational movement of the pin after formation of the filter assembly. The mounting body also can include threads thereon for threading the filter assembly into a bulkhead or the like directly or for securing the filter assembly into a bulkhead by means of a mating nut. In addition, the mounting body can be made straight and the filter assembly can be soldered into the bulkhead.

2 Claims, 4 Drawing Figures

SOLDERLESS FILTER ASSEMBLY

This invention relates to a solderless filter sleeve assembly and, more specifically, to a filter sleeve assembly utilizing a pair of spring members to provide solderless electrical connection between the shell or mounting body surrounding the filter sleeve and the electrical pin member passing through the bore of the filter sleeve.

In the formation of filter sleeve assemblies in accordance with the prior art, it has always been necessary to provide good electrical connection between the inner diameter of filter sleeves and an electrically conductive pin passing through the bore thereof and between the outer diameter of the filter sleeves and the housing or mounting body positioned therearound. Prior art devices of this type have required soldering in order to provide such good electrical connection. Soldering, as is well known, has certain limitations in the electronic field and particularly in the area of filter sleeves. Excessive heat which is provided from soldering has a tendency to degrade the filter sleeves and render them less fit for their intended use.

In accordance with the present invention, the necessity of soldering is eliminated by the use of a pair of spring members, one of the spring members being locked around the electrically conductive pin passing through the bore of the filter sleeve and having convex tines to make a pressure fit and good electrical connection between the pin and the inner diameter of the sleeve filter. A second spring member which is frictionally locked within the housing or mounting body surrounding the filter sleeve has concave tines thereon for making good electrical connection between the outer diameter of the filter sleeve and the mounting body. The filter sleeve and spring members are encapsulated within the mounting body by means of a potting material which is positioned beyond a pot stop positioned between the potting material and the filter sleeve and springs at both ends of the mounting body. The pin also includes an enlarged portion which is positioned within one of the potted regions to prevent lateral and rotational movement of the pin after assembly.

It is therefore an object of this invention to provide a sleeve filter assembly which provides good electrical connection at both the internal and external diameters thereof without the necessity of soldering.

It is a further object of this invention to provide a filter sleeve assembly having a spring member within the sleeve bore having convex tines thereon and a spring member at the outer surface of the filter sleeve having concave tines thereon.

The above objects and still further objects of the invention will immediately become apparent to those skilled in the art after consideration of the following preferred embodiment thereof, which is provided by way of example and not by way of limitation wherein.

Figure 1:
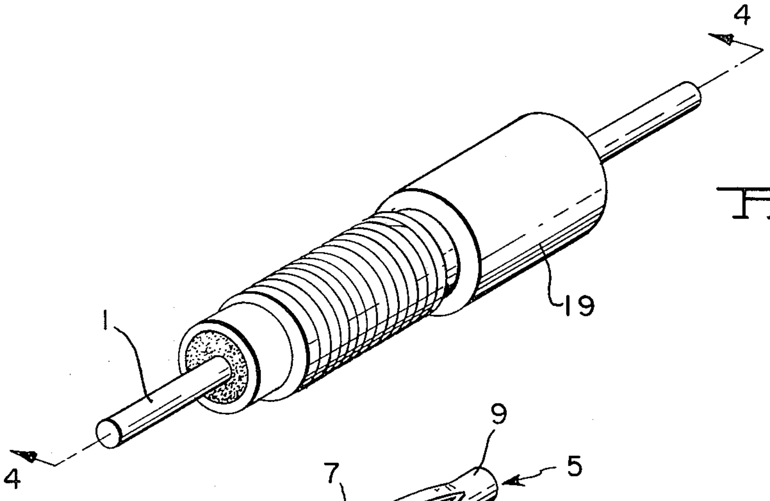
FIG. 1 shows a view in elevation of the entire filter assembly in accordance with the present invention after all the parts have been assembled.
Figure 2:
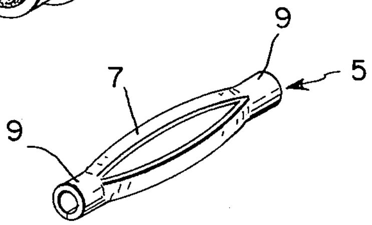
FIG. 2 is a view in elevation of the spring member which is positioned within the bore of the filter sleeve in accordance with the present invention.
Figure 3:
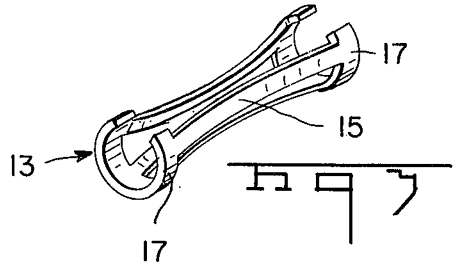
FIG. 3 is a view in elevation of the external spring which surrounds the filter sleeve in accordance with the present invention.
Figure 4:
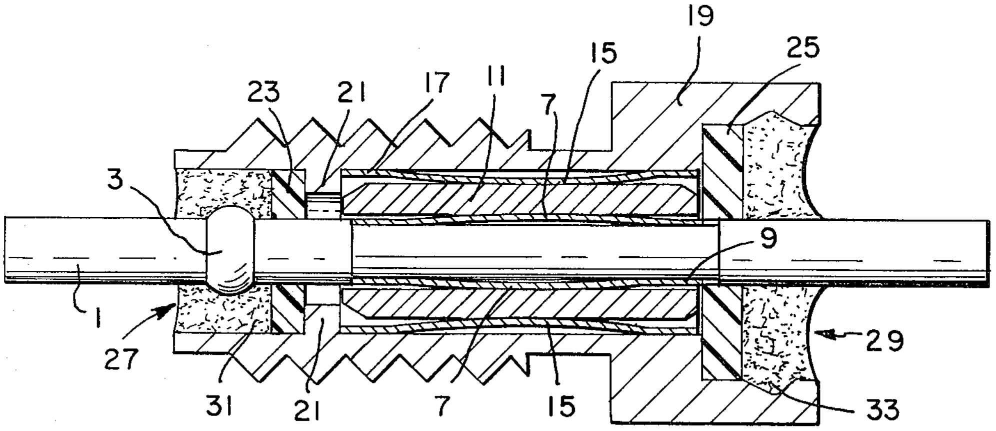
FIG. 4 is a cross sectional view of the assembled filter sleeve assembly in accordance with the present invention as taken along the line 4—4 of FIG. 1.

Referring now to the FIGURES, and particularly to FIGS. 1 and 4, there is shown a filter assembly in accordance with the present invention. The assembly includes an electrically conductive pin 1 which is preferably formed of copper or copper alloy. The pin 1 includes an enlarged region 3 as will be described in more detail hereinbelow. An internal spring 5, which is preferably formed of beryllium copper, but which can be made from any material having spring properties and which is electrically conductive is positioned on the pin 1. The spring member 5 includes annular regions 9 which lock onto the pin 1 by a friction fit and convex shaped tines 7 which extend outwardly from the pin 1 as best shown in FIG. 4. The tines 7 make a pressure fit with the internal diameter of the filter sleeve 11. Filter sleeves of the type shown herein are well known in the prior arts. An external spring 13 having tines 15 which are concave in shape and a split annular region 17 is positioned within the shell, mounting body or housing 19. The spring 13 is formed of the same type of material as the spring 5. The mounting body 19 is formed of any hard electrically conductive material. The spring member 13 has spring action in the tines 15 as well as in the region 17 due to the split. The spring member 13 is positioned within the mounting body 19 through one of the side openings thereof and forced inwardly until it contacts the flange member 21 which is an integral part of the mounting body 19. The spring 13 also contacts the outer surface of the filter sleeve 11 as shown in FIG. 4. A pair of pot stops 23 and 25 are positioned around the pin 1 and within hollow regions 27 and 29 in the opposite ends of the mounting body 19. The pot stops seal off the filter sleeve 11 and springs 5 and 13 from the external environment during the potting step. The pot stops can be formed of plastic or any appropriate insulating material. Their purpose is to keep the potting material from running therebeyond into the region of the filter sleeve and also act as centering devices between the pin and body. It is therefore desirable that the pot stops provide a force fit with the inner diameter of the grooves formed in the opposite ends of the mounting body 19 and with the pin 1. A potting material which is non-conductive such as epoxy resin is then formed in the regions 27 and 29, the potting material being shown as 31 and 33. The potting material bonds to both the mounting body 19 and the pin 1 and, in the case of the region 27, also bonds to the enlarged region 3 to prevent lateral and/or rotational movement of the pin.

An actual assembly of the unit would require that the pot stop 23, positioned on pin 1, be positioned first and that the spring member 5 then be placed thereon via the region 29 whereby the spring 5 can then be properly positioned within the mounting body 19. The filter 11 is then slid in place and the spring 13 is then forced around the filter 11 until it abuts the flange 21. At this time, the pot stop 25 is positioned as shown in FIG. 4 and the potting material is then formed in the regions 27 and 29 as shown.

It can therefore be seen that there is provided a relatively simple filter sleeve assembly which requires no solder and completely does away with the requirement of solder, thereby providing the great advantage in the removal of heat from the heat sensitive filter sleeve member 11.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A solderless filter assembly, comprising:
   - a feed-through type filter of sleeve configuration,
   - a conductive pin,
   - a first resilient spring connecting an internal surface of said filter to said conductive pin projecting through said filter,
   - a conductive housing receiving said filter and said pin,
   - a second resilient spring received in said housing against an internal flange and electrically connecting an external surface of said filter with an internal surface of said housing,
   - opposite ends of said housing being provided with corresponding recesses,
   - opposite ends of said pin projecting outwardly of said recesses,
   - nonconductive sealing means press-fit internally of each recess and in encirclement about said pin for sealing said filter and said first and second springs internally of said housing, and
   - nonconductive potting material in said recesses provided in said housing bonded to said housing and bonded in encirclement about said pin.

2. The structure as recited in claim 1, wherein, one end of said pin includes a region of non-uniform shape freely disposed within one of said recesses provided in said housing, said potting material bonding to said non-uniform shape and to said housing to prevent movement of said pin.

* * * * *